(12) United States Patent
Aoki (10) Patent No.: US 7,679,394 B2
(45) Date of Patent: Mar. 16, 2010

(54) POWER SUPPLY NOISE RESISTANCE TESTING CIRCUIT AND POWER SUPPLY NOISE RESISTANCE TESTING METHOD

(75) Inventor: Mutsumi Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 463 days.

(21) Appl. No.: 11/607,941

(22) Filed: Dec. 4, 2006

(65) Prior Publication Data
US 2007/0132480 A1 Jun. 14, 2007

(30) Foreign Application Priority Data
Dec. 8, 2005 (JP) .............................. 2005-355156

(51) Int. Cl.
*G01R 31/36* (2006.01)
*G01R 31/28* (2006.01)
(52) U.S. Cl. .................................. 324/771; 324/158.1
(58) Field of Classification Search ........................ None
See application file for complete search history.

(56) References Cited

U.S. PATENT DOCUMENTS

| 4,893,029 | A * | 1/1990 | Matsuo et al. | 327/546 |
|---|---|---|---|---|
| 5,818,247 | A * | 10/1998 | Pyun | 324/756 |
| 6,912,701 | B2 * | 6/2005 | Kundu | 716/5 |
| 6,949,942 | B2 * | 9/2005 | Eldridge et al. | 324/765 |
| 7,116,114 | B2 * | 10/2006 | Kajita | 324/613 |
| 7,342,405 | B2 * | 3/2008 | Eldridge et al. | 324/765 |
| 7,355,429 | B2 * | 4/2008 | Jenkins et al. | 324/763 |
| 7,443,187 | B2 * | 10/2008 | Jenkins et al. | 324/763 |
| 2002/0125904 | A1 * | 9/2002 | Eldridge et al. | 324/765 |
| 2004/0088615 | A1 * | 5/2004 | Kundu | 714/724 |
| 2006/0092675 | A1 * | 5/2006 | Kajita | 363/39 |
| 2006/0126248 | A1 * | 6/2006 | Choi et al. | 361/93.1 |
| 2006/0214672 | A1 * | 9/2006 | Jenkins et al. | 324/713 |
| 2008/0258751 | A1 * | 10/2008 | Jenkins et al. | 324/763 |

FOREIGN PATENT DOCUMENTS

| JP | 5-107321 | 4/1993 |
|---|---|---|
| JP | 2003-050264 A | 2/2003 |
| WO | WO 0173929 A2 * | 10/2001 |

OTHER PUBLICATIONS

English Translation of JP 2003-050264A with publication date Feb. 21, 2003.*

* cited by examiner

*Primary Examiner*—Jermele M Hollington
(74) *Attorney, Agent, or Firm*—Foley & Lardner LLP (57) ABSTRACT

Provided is a power supply noise resistance testing circuit, in which a test pattern is applied to a data input portion of a functional block formed on a semiconductor chip and a voltage on which a power supply noise is superimposed is supplied to a power supply portion of the functional block, thereby testing a power supply noise resistance of the functional block. In the power supply noise resistance testing circuit, a power supply noise generating circuit for generating the power supply noise is provided around or inside the functional block. A power supply of the power supply noise generating circuit is connected with a power supply of the functional block through a connection path to transmit the power supply noise.

16 Claims, 6 Drawing Sheets

POWER SUPPLY NOISE RESISTANCE TESTING CIRCUIT AND POWER SUPPLY NOISE RESISTANCE TESTING METHOD

BACKGROUND OF THE INVENTION

1. Field of the Invention

The present invention relates to a power supply noise resistance testing circuit, and more particularly, to a power supply noise resistance testing circuit in which a power supply noise necessary to test a power supply noise resistance of a functional block is optimally generated, and a power supply noise resistance testing method for the power supply noise resistance testing circuit.

2. Description of the Related Art

Evolution of an LSI manufacturing process advances increases in speed and degree of integration and a reduction in voltage on an LSI. In recent years, a malfunction of the LSL which is caused by power supply noises has become a large problem.

Up to now, past experiences, a result obtained by evaluating an evaluation sample chip such as a test element group (TEG) chip, a result obtained by simulation, and the like are fed back to the LSI manufacturing process. The LSI is designed in view of a power supply noise resistance (for example, a power supply wiring structure or an on-chip capacitor arrangement) The power supply noise resistance of the LSI changes depending on manufacturing variations or the like.

Therefore, a method capable of easily measuring the power supply noise resistance is required at a time of a shipment inspection of the LSI, an acceptance inspection thereof, or a failure analysis thereof.

In the past, techniques for testing the power supply noise resistance have been developed. An example of the techniques is disclosed in JP 05-107321 A.

JP 05-107321 A discloses an integrated circuit measuring device and the summary of the device is as follows. A noise generated by a power supply noise generating source under the control of a control section of a tester is superimposed on power to be supplied from a power supply to a power supply terminal of an integrated circuit under the control of the control section. Then, the power is supplied to the integrated circuit. A test pattern is inputted into the integrated circuit. A signal outputted from the integrated circuit is compared with an expected value for the test pattern by a comparator. Therefore, a function test is performed in a state in which the noise is superimposed, thereby measuring a noise margin.

A semiconductor device testing device is disclosed in JP 2003-050264 A. The testing device includes a tester for generating a first test pattern signal for function test and a second test pattern signal similar to a simulated power supply noise and an evaluation board in which a noise superimposing circuit is provided and to which a semiconductor device is attached. In the testing device, the first test pattern signal is applied to a signal input terminal of the semiconductor device attached to the evaluation board. The second test pattern signal is applied to the noise superimposing circuit to generate the simulated power supply noise. The power supply noise is applied to a power supply of the attached semiconductor device. Then, the resistance of the semiconductor device to the power supply noise is evaluated.

As described above, in the conventional case, it has been recognized that the easy measurement of the power supply noise resistance is required at the time of the shipment inspection of the LSI, the acceptance inspection thereof, or the failure analysis thereof. However, no power supply noise resistance test is performed on the LSI or only the power supply noise resistance test in which the power supply noise generating source is provided in the tester or on the test board (evaluation board) and the power supply noise is applied from the outside of the LSI is performed as described in JP 05-107321 A or JP 2003-050264 A.

When the integrated circuit is composed of a plurality of functional blocks (hereinafter referred to as IP cores in this section), the power supply noise resistance of each of the IP cores cannot be tested with pinpoint accuracy only by the application of the power supply noise from the outside of the LSI.

Although a low-frequency power supply noise can be applied, a high-frequency power supply noise which is a recent problem cannot be applied.

SUMMARY OF THE INVENTION

The present invention has been made in view of the above-mentioned circumstances. An object of the present invention is to provide a power supply noise resistance testing circuit capable of performing a power supply noise resistance test on each of the functional blocks included in an electronic device in parallel with a function test on each of the functional blocks with pinpoint accuracy at a high frequency, and a power supply noise resistance testing method for the power supply noise resistance testing circuit.

In order to solve the above-mentioned problems, there is provided a power supply noise resistance testing circuit for applying a test pattern to a data input portion of a functional block formed on a semiconductor chip and supplying a voltage on which a power supply noise is superimposed to a power supply portion of the functional block to test a power supply noise resistance of the functional block, including: a power supply noise generating circuit which is provided in one of a peripheral portion and an inner portion of the functional block and includes a power supply portion, for generating the power supply noise; and a connection path for connecting the power supply portion of the power supply noise generating circuit with a power supply portion of the functional block to transmit the power supply noise.

Further, the power supply noise generating circuit may include drive control means for generating the power supply noise.

Further, the power supply portion of the functional block may be a main power supply of the functional block.

Further, the power supply portion of the functional block may be a power supply other than a main power supply of the functional block.

Further, the power supply noise generating circuit may include a plurality of noise generating circuits connected in series, each of which includes an output portion connected with an on-chip capacitor when the functional block operates.

Further, the output portion of each of the noise generating circuits may include a positive phase output portion and a negative phase output portion, each of which is connected with the on-chip capacitor when the functional block operates.

Further, each of the noise generating circuits may include: a first selector including an output terminal, for selecting one of a noise signal outputted from drive control means and a reference potential based on a test mode signal outputted from the drive control means; a second selector including an output terminal, for selecting one of a clock signal and the reference potential based on the test mode signal outputted from the drive control means; a bistable circuit including a first input terminal connected with the output terminal of the first selector, a second input terminal connected with the output terminal of the second selector, and an output terminal; and a driver connected with the output terminal of the bistable circuit, and the driver may include an output terminal connected with the on-chip capacitor when the functional block operates.

Further, in one of the power supply noise generating circuits, an output signal from the driver of a noise generating circuit preceding to the one of the noise generating circuits may be supplied as the noise signal to the first selector of the one of the noise generating circuits, the clock signal may be supplied to the second selector of the one of the noise generating circuits, an output signal from the driver of the one of the noise generating circuits may be supplied as the noise signal to the output terminal of the first selector of a noise generating circuit subsequent to the one of the noise generating circuits, and the clock signal may be supplied to the second selector of the noise generating circuit subsequent to the one of the noise generating circuits.

Further, a first noise generating circuit of the power supply noise generating circuits may include: a first selector including an output terminal, for selecting one of a noise signal outputted from drive control means and a reference potential based on a test mode signal outputted from the drive control means; a second selector including an output terminal, for selecting one of a clock signal and the reference potential based on the test mode signal outputted from the drive control means; a bistable circuit including a first input terminal connected with the output terminal of the first selector, a second input terminal connected with the output terminal of the second selector, and an output terminal; and a first driver connected with the output terminal of the bistable circuit, the first driver may include an output terminal connected with the on-chip capacitor when the functional block operates, a second noise generating circuit of the noise generating circuits may include a second driver connected with the output terminal of the first driver, the second driver may include an output terminal connected with the on-chip capacitor when the functional block operates; and each of noise generating circuits subsequent to the second noise generating circuit may have a structure identical to the structure of the second noise generating circuit.

Further, a first noise generating circuit of the noise generating circuits may include: a first selector including an output terminal, for selecting one of a noise signal outputted from drive control means and a reference potential; a second selector including an output terminal, for selecting one of a clock signal and the reference potential; a bistable circuit including a first input terminal connected with the output terminal of the first selector, a second input terminal connected with the output terminal of the second selector, a positive phase output terminal, and a negative phase output terminal; a first driver connected with the positive phase output terminal of the bistable circuit; and a second driver connected with the negative phase output terminal of the bistable circuit, the first driver may include an output terminal connected with an on-chip capacitor when the functional block operates, the second driver may include an output terminal connected with an on-chip capacitor when the functional block operates, and each of noise generating circuits subsequent to the first noise generating circuit may include: a positive phase noise data transmission system including a selector, a bistable circuit, and a driver in which an output signal from the first driver sequentially passes therethrough, the driver including an output terminal connected with an on-chip capacitor when the functional block operates; and a negative phase noise data transmission system including a selector, a bistable circuit, and a driver in which an output signal from the second driver sequentially passes therethrough, the driver including an output terminal connected with an on-chip capacitor when the functional block operates.

Further, the on-chip capacitor may include a semiconductor device including a control electrode and the control electrode of the semiconductor device may be connected with the output portion of each of the noise generating circuit.

Further, the on-chip capacitor may include: a first field effect transistor of a first conductivity type, including a gate; a second field effect transistor of a second conductivity type reverse to the first conductivity type, including a gate; and an inverter including an input terminal and an output terminal connected with the gate of the second field effect transistor, and the gate of the first field effect transistor and the input terminal of the inverter may be connected with an output terminal of a driver.

Further, the on-chip capacitor connected with the first driver may be a first field effect transistor of a first conductivity type and the on-chip capacitor connected with the second driver may be a second field effect transistor of a second conductivity type reverse to the first conductivity type.

Further, the power supply noise generating circuit may include a plurality of noise generating circuits connected in series, and each of the noise generating circuits may include: a first selector including an output terminal, for selecting one of a noise signal outputted from drive control means and a reference potential based on a test mode signal outputted from the drive control means; a second selector including an output terminal, for selecting one of a clock signal and the reference potential based on the test mode signal outputted from the drive control means; a bistable circuit including a first input terminal connected with the output terminal of the first selector, a second input terminal connected with the output terminal of the second selector, and an output terminal; and a driver connected with the output terminal of the bistable circuit.

Further, according to the present invention, there is provided a power supply noise resistance testing method of applying a test pattern to a data input portion of a functional block formed on a semiconductor chip and supplying a voltage on which a power supply noise is superimposed to a power supply portion of the functional block to test a power supply noise resistance of the functional block, including: connecting a power supply of the power supply noise generating circuit of the power supply noise resistance testing circuit according to claim 1 which is provided in the one of the peripheral portion and the inner portion of the functional block with a power supply of the functional block; and supplying the power supply noise from the power supply of the power supply noise generating circuit to the power supply portion of the functional block.

According to the present invention, the power supply noise generating circuit is provided around or inside the functional block and the power supply portion of the power supply noise generating circuit is connected with the power supply portion of the functional block through the connection path. Therefore, when the functional block is to be tested, a suitable power supply noise can be supplied to each part of the functional block to test the power supply noise resistance. A high-frequency power supply noise resistance of the functional block can be tested.

The power supply noise resistance can be tested with pinpoint accuracy for each functional block formed on the semiconductor chip. The on-chip capacitor acts during the operation of the functional block, so the power supply noise resistance of the functional block which is operating can be enhanced. The power supply noise generating circuit also serves as the on-chip capacitor, so it is possible to minimize an area overhead necessary to mount the power supply noise resistance testing circuit (power supply noise generating circuit) on the semiconductor chip.

DETAILED DESCRIPTION OF THE PREFERRED EMBODIMENTS

According to the present invention, a power supply noise generating circuit is provided around or inside a functional block. A power supply section of the power supply noise generating circuit is connected with a power supply section of the functional block through connection path. The power supply noise generating circuit is synchronized with a clock by drive control means.

Embodiment 1

Figure 1:
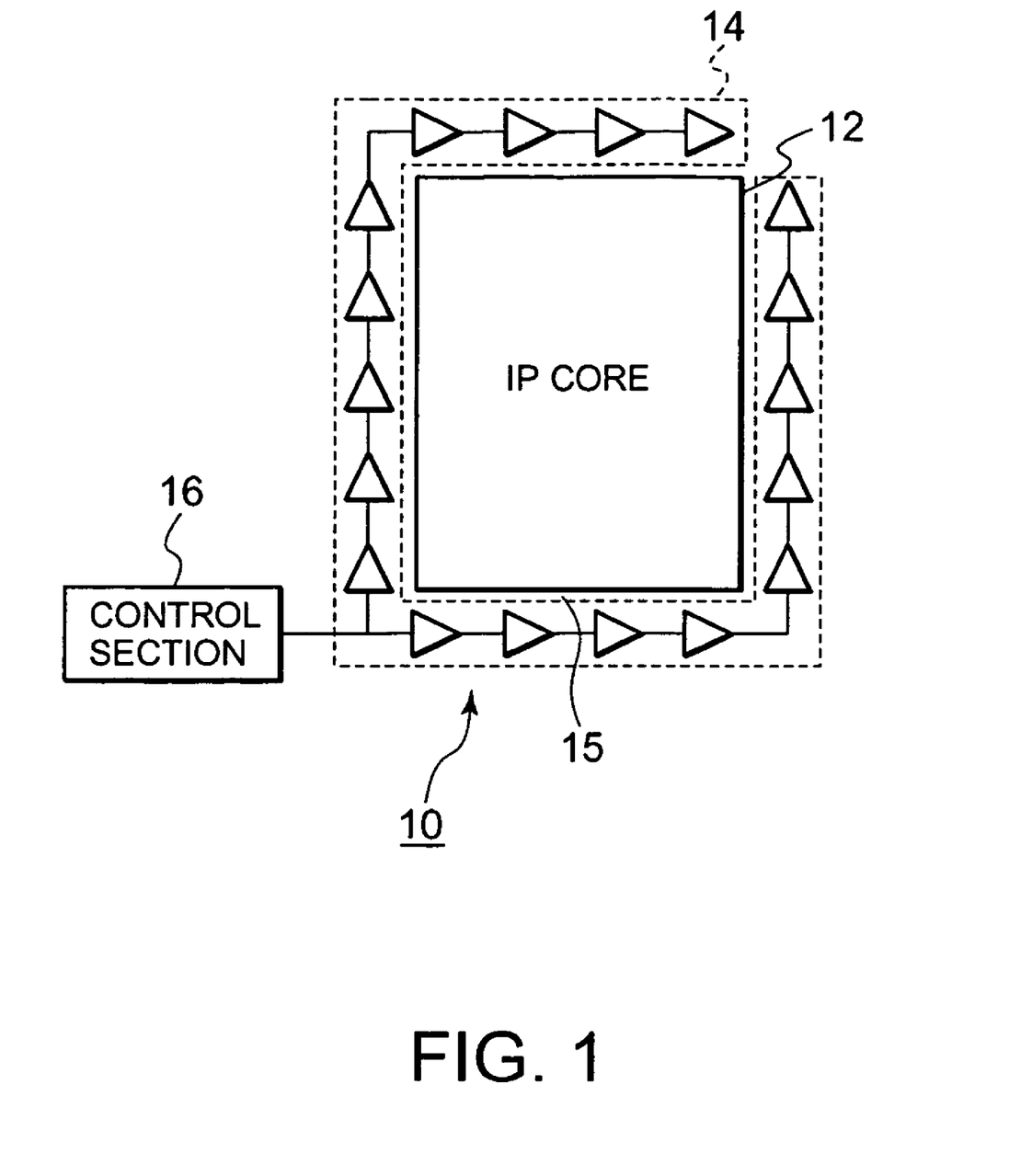
FIG. 1 is a diagram showing an electrical structure of a power supply noise resistance testing circuit according to Embodiment 1 of the present invention.
Figure 2:
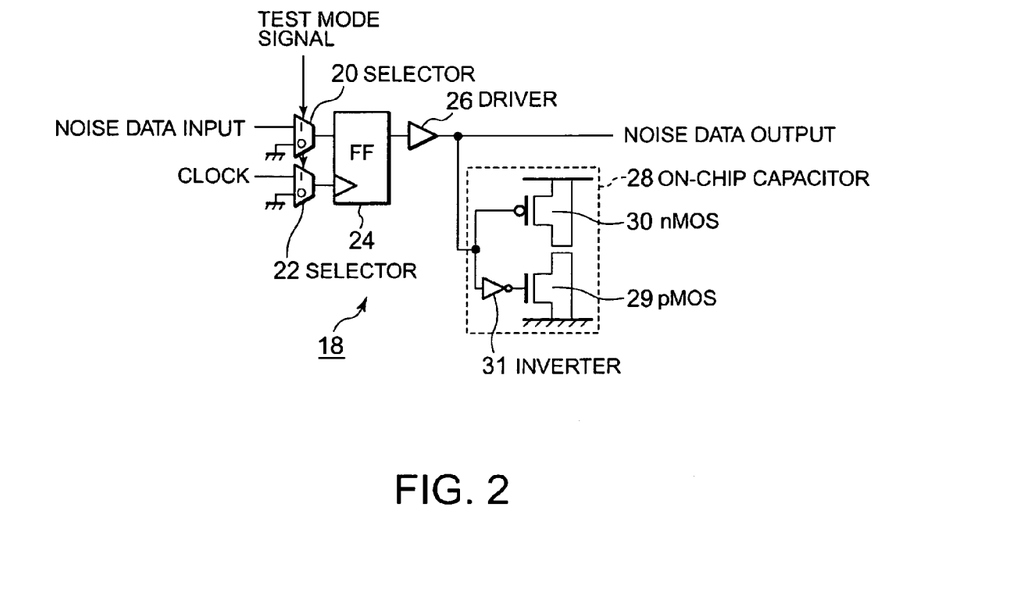
FIG. 2 is a diagram showing a unit circuit included in the power supply noise resistance testing circuit.

FIG. 1 is a diagram showing an electrical structure of a power supply noise resistance testing circuit according to Embodiment 1 of the present invention. FIG. 2 is a diagram showing a power supply noise generating unit circuit included in an on-chip capacitor/power supply noise generating circuit of the power supply noise resistance testing circuit.

A power supply noise resistance testing circuit 10 according to this embodiment is a circuit in which a noise generating circuit is provided around a functional block (hereinafter also referred to as an intellectual property (IP) core), a power supply of the noise generating circuit is connected with a power supply of the IP core, and a power supply noise is transmitted to the IP core through a connection path therebetween to test a power supply noise resistance of the IP core. As shown in FIG. 1, the power supply noise resistance testing circuit 10 includes: an on-chip capacitor/power supply noise generating circuit 14 which is formed on a semiconductor chip and provided immediately around a circuit (IP core) 12 sensitive to a power supply noise, such as a PLL circuit, an SRAM, a data path, or a high-speed serializer/deserializer (SerDes) circuit, which is included in an electronic device; and a control section 16 connected with an input terminal of the on-chip capacitor/power supply noise generating circuit 14.

The on-chip capacitor/power supply noise generating circuit 14 includes a plurality of power supply noise generating circuits (hereinafter referred to as unit circuits) 18 connected in series, each of which is shown in FIG. 2. A power supply of the on-chip capacitor/power supply noise generating circuit 14 is connected with a power supply of the IP core 12 through a power supply line 15.

The unit circuit 18 includes a first selector 20 for selecting between noise data outputted from the control section 16 and a ground potential, a second selector 22 for selecting between a clock signal and the ground potential, a flip-flop (FF) circuit 24 having a data input terminal connected with an output terminal of the first selector 20 and a clock input terminal connected with an output of the second selector 22, a driver 26 connected with an output terminal of the FF circuit 24, and an on-chip capacitor 28 connected with an output terminal of the driver 26.

Each of the first selector 20 and the second selector 22 has a selection control input terminal to which a selection signal is supplied from the control section 16. When the IP core 12 is set to a test mode, a test mode signal of "1" is supplied as the selection signal to the selection control input terminal. When the IP core 12 operates, a test mode signal of "0" is supplied as the selection signal to the selection control input terminal.

The on-chip capacitor 28 is composed of a p-type MOS transistor 29, an n-type MOS transistor 30, and an inverter 31. A gate of the p-type MOS transistor 29 is connected with the output terminal of the driver 26 through the inverter 31 and a source and a drain thereof are connected with a ground potential terminal. A gate of the n-type MOS transistor 30 is directly connected with the output terminal of the driver 26 and a source and a drain thereof are connected with the power supply. The driver 26 drives a next stage unit circuit to fluctuate a power source supply voltage.

Figure 6:
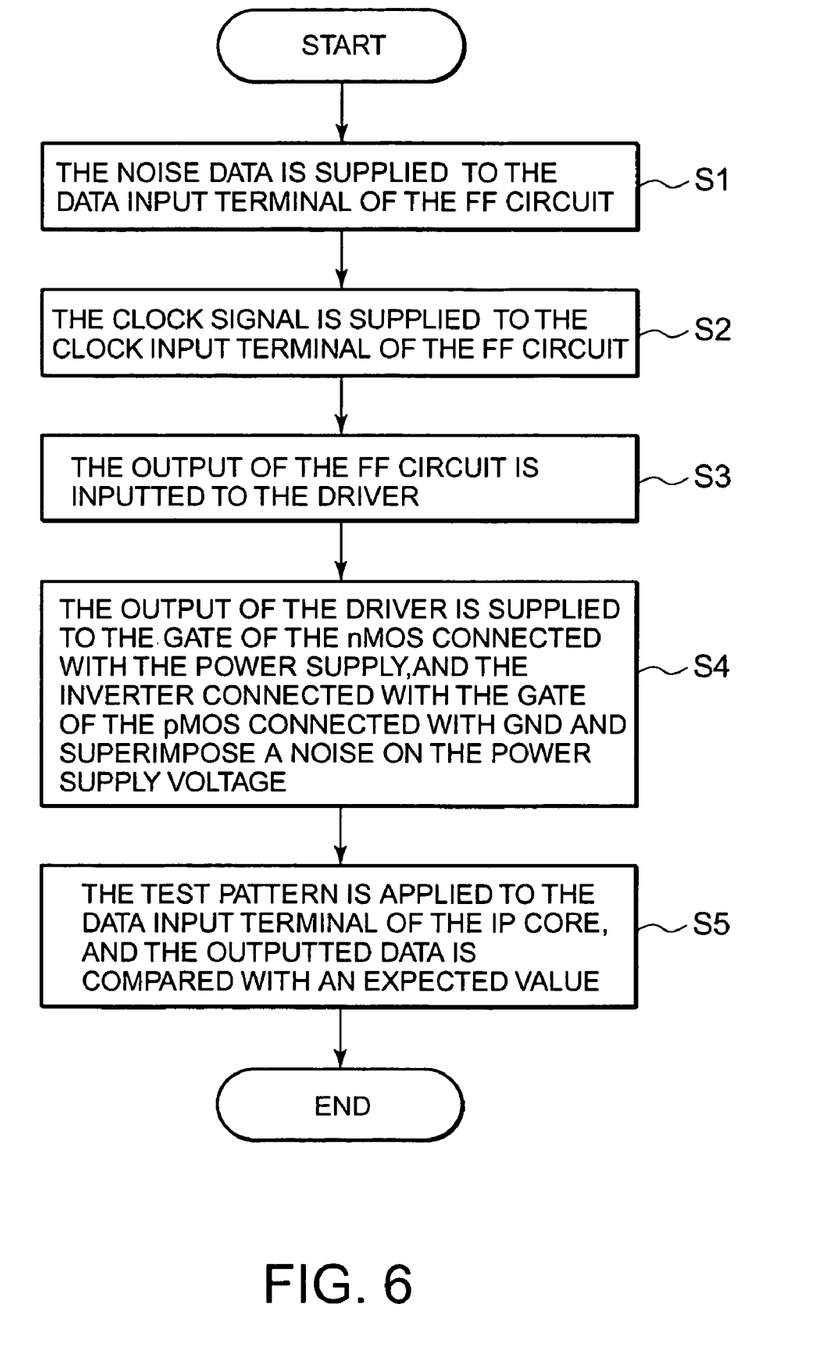
FIG. 6 is a diagram showing operations of a power supply noise resistance testing circuit according to Embodiment 1 of the present invention.

Next, an operation of this embodiment will be described with reference to FIGS. 1, 2 and 6.

When a power supply noise resistance test operation using the power supply noise resistance testing circuit 10 starts to test the IP core 12, the noise data for a preset data pattern and the clock signal are outputted from the control section 16 and the test mode signal of "1" is outputted therefrom.

The noise data is supplied to the data input terminal of the selector 20. The test mode signal is supplied to the selection control input terminal of these lector 20. The noise data is applied from the output terminal of the selector 20 to the data input terminal of the FF circuit 24 (step S1).

In parallel with the application of the noise data, the clock signal is supplied to the clock input terminal of the selector 22. The test mode signal is supplied to the selection control input terminal of the selector 22. The clock signal is applied from the output terminal of the selector 22 to the clock input terminal of the FF circuit 24 (step S2).

Then, the FF circuit 24 generates an output signal corresponding to the noise data, so the noise data is outputted from the driver 26 (step S3). At this time, the power supply voltage of the on-chip capacitor/power supply noise generating circuit 14 is fluctuated, so a noise is superimposed thereon (step S4). This noise component is transmitted from the on-chip capacitor/power supply noise generating circuit 14 to the power supply of the IP core 12 through the power supply line 15. Therefore, a driving voltage on which the noise component is superimposed is supplied to the IP core 12.

While the driving voltage is being supplied to the IP core 12, a test pattern for performing a function evaluation is applied to a data input terminal of the IP core 12 as in the conventional case. A response result to the test pattern is outputted as data from a data output terminal of the IP core 12. The outputted data is compared with an expected value for the test pattern. The power supply noise resistance of the IP core 12 is evaluated based on a result obtained by comparison (step S5).

The unit circuit 18 is synchronized with the clock, so the power supply noise resistance can be tested at a high frequency.

In the power supply noise resistance test of the IP core 12, the p-type MOS transistor 29 and the n-type MOS transistor 30 which are included in the on-chip capacitor 28 are turned on/off based on a pattern of the noise data. An on period of each of the p-type MOS transistor 29 and the n-type MOS transistor 30 is shorter than the entire period, so a reduction in power supply noise caused by the turning on/off of the on-chip capacitor 28 is slight.

Therefore, this does not hinder the power supply noise resistance test of the IP core 12, with the result that the high-frequency power supply noise resistance test as described above can be successfully conducted.

When the power supply noise resistance test is completed to supply the test mode signal of "0" from the control section 16 to the selectors 20 and 22, the input of the FF circuit 24 is clamped to "0". Therefore, the noise data does not appear in the output of the FF circuit 24.

Then, a positive voltage is generated as the output of the driver 26, so the p-type MOS transistor 29 and the n-type MOS transistor 30 which are included in the on-chip capacitor 28 are turned on.

Then, the on-chip capacitor 28 is connected in parallel with the power supply of the IP core 12 through the power supply line 15. Therefore, it is useful to make the reduction in influence of the noise caused on the power supply line, that is, the absorption of the noise, thereby enhancing the power supply noise resistance of the IP core.

As described above, according to this embodiment, the unit circuits are dependently connected and arranged around the IP core. The noise data is supplied to a unit circuit located in a start end, of the unit circuits. The power supply of the on-chip capacitor/power supply noise generating circuit is connected with the power supply of the IP core. Therefore, when the IP core is to be tested, a suitable power supply noise is supplied to each portion of the IP core, so the power supply noise resistance can be tested. In addition, the high-frequency power supply noise resistance of the IP core can be tested.

The power supply noise resistance can be tested for each IP core formed on the semiconductor chip. In other words, the power supply noise resistance of each IP core of the semiconductor chip can be tested with pinpoint accuracy. The on-chip capacitor acts during the operation of the IP core, so the power supply noise resistance of the IP core which is operating can be enhanced. The power supply noise generating circuit also serves as the on-chip capacitor, so it is possible to minimize an area overhead necessary to mount the power supply noise resistance testing circuit (power supply noise generating circuit) on the semiconductor chip.

Embodiment 2

Figure 3:
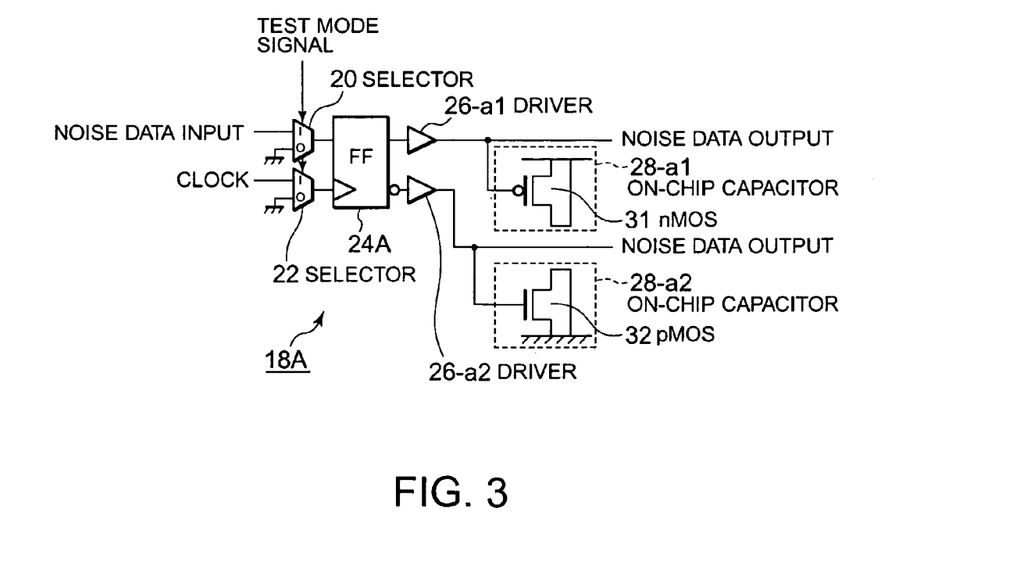
FIG. 3 is a diagram showing a unit circuit included in a power supply noise resistance testing circuit according to Embodiment 2 of the present invention.

FIG. 3 is a diagram showing a unit circuit included in a power supply noise resistance testing circuit according to Embodiment 2 of the present invention.

A structure in this embodiment is significantly different from that in Embodiment 1 in a point that a driver is provided for each of a positive phase output terminal and a negative phase output terminal of the FF circuit and an on-chip capacitor is provided for each driver.

According to a power supply noise resistance testing circuit 10A (not shown in FIG. 3) in this embodiment, as shown in FIG. 3, in a first stage unit circuit 18A of an on-chip capacitor/power supply noise generating circuit 14A, a positive phase output terminal of a FF circuit 24A is connected with a driver 26-$a$1 and a negative phase output terminal of the FF circuit 24A is connected with a driver 26-$a$2. An on-chip capacitor 28-$a$1 is provided on an output side of the driver 26-$a$1 and an on-chip capacitor 28-$a$2 is provided on an output side of the driver 26-$a$2. The on-chip capacitor 28-$a$1 includes an n-type MOS transistor 31 whose gate is connected with an output terminal of the driver 26-$a$1 and whose source and drain are connected with a voltage source. The on-chip capacitor 28-$a$2 includes a p-type MOS transistor 32 whose gate is connected with an output terminal of the driver 26-$a$2 and whose source and drain are connected with a ground potential terminal.

In each of subsequent stages next to the first stage, in order to construct difference power supply noise generating systems for the respective drivers 26-$a$1 and 26-$a$2, a selector for generating the clock signal in response to the test mode signal, which is identical to that as described above, a bistable circuit which receives the noise data at a data input terminal and the clock signal passing through the selector at a clock input terminal, and a driver connected with an output terminal of the bistable circuit are provided for each of the stages of each of the systems.

Structures in this embodiment which are other than the above-mentioned structure are identical to those in Embodiment 1. Therefore, the same constituent portions are expressed by the same reference symbols and the detailed description is omitted here.

Figure 7:
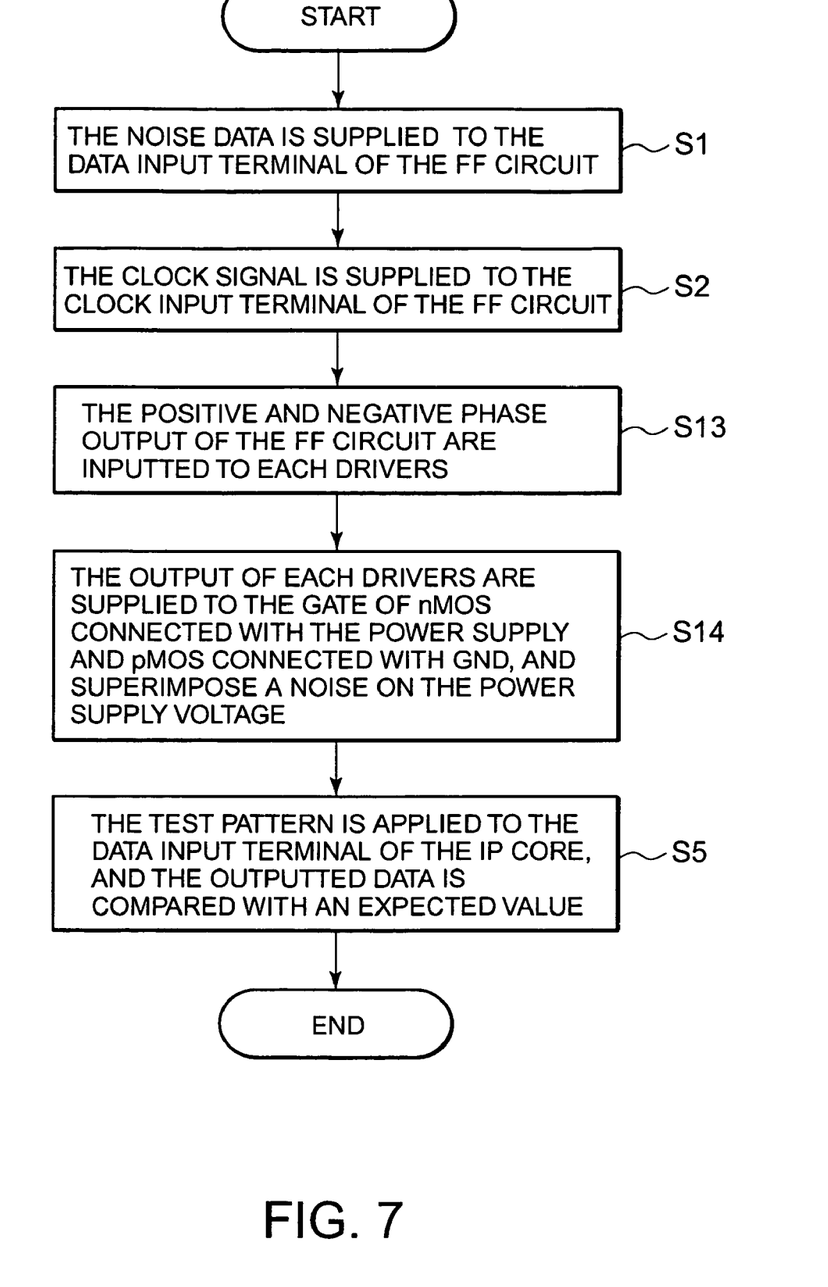
FIG. 7 is a diagram showing operations of a power supply noise resistance testing circuit according to Embodiment 2 of the present invention.

Next, an operation of this embodiment will be described with reference to FIGS. 3 and 7.

Even in this embodiment, when the power supply noise resistance test starts, the test mode signal of "1" is supplied from the control section 16 to the selectors 20 and 22. In addition, the noise data is inputted into the selector 20 and the clock signal is inputted to the selector 22.

Then, the noise data and the clock signal are supplied to the FF circuit 24A (step S1 and S2). The FF circuit 24A outputs an output signal corresponding to the noise data from the positive phase output terminal. In addition, the FF circuit 24A outputs a negative phase output signal corresponding to reversed data of the noise data from the negative phase output terminal (step S13).

The driver 26-$a$1 generates a voltage on which the noise data is superimposed. The driver 26-$a$2 generates a voltage on which the reversed noise data is superimposed (step S14). The noise components are transmitted to the power supply of the IP core 12 through a power supply line (not shown in FIG. 3) of the on-chip capacitor/power supply noise generating circuit 14A. Therefore, the noise components are used for the power supply noise resistance test at the time of the function test of the IP core 12.

A test pattern signal is supplied from a tester (not shown) to the data input terminal (not shown) of the IP core 12 driven by the above-mentioned operation. The IP core 12 outputs a result obtained by test from the data output terminal. The result obtained by test is compared with an expected value for the test pattern signal, so the power supply noise resistance is tested at the time of the function test (step S5).

While the power supply noise resistance test is being performed, the n-type MOS transistor 31 included in the on-chip capacitor 28-a1 and the p-type MOS transistor 32 included in the on-chip capacitor 28-a2 are turned on/off based on a waveform pattern of the voltage on which the noise data is superimposed.

An on period of each of the on-chip capacitors 28-a1 and 28-a2 is shorter than the entire period, so a reduction in power supply noise supplied to the IP core 12 is slight. Therefore, this does not hinder the power supply noise resistance test of the IP core 12.

However, when the power supply noise resistance test is completed to supply the test mode signal of "0" from the control section 16 to the selectors 20 and 22, the input of the FF circuit 24A is clamped to "0". Therefore, the noise data does not appear in each of the positive phase output and the negative phase output of the FF circuit 24A.

Then, a positive voltage is generated as the output of the driver 26-a1, so the n-type MOS transistor 31 included in the on-chip capacitor 28-a1 is turned on. A positive voltage is generated as the output of the driver 26-a2, so the p-type MOS transistor 32 included in the on-chip capacitor 28-a2 is also turned on.

Then, the on-chip capacitors 28-a1 and 28-a2 are connected in parallel with the output lines of the drivers 26-a1 and 26-a2. Therefore, it is useful to reduce the influence of the noise caused on the power supply line of the IP core 12, thereby enhancing the power supply noise resistance of the IP core.

As described above, according to this embodiment, the same effects as those in Embodiment 1 can be obtained. In addition to this, the power supply noise generated in Embodiment 1 and the power supply noise reverse thereto in phase can be simultaneously used for the power supply noise resistance test.

In this embodiment, each of the on-chip capacitors is a polysilicon capacitor of a MOS transistor. A wiring capacitor or a static capacitor of a transistor may be used. A metal-insulator-metal (MIM) capacitor or the like may be used.

Embodiment 3

Figure 4:
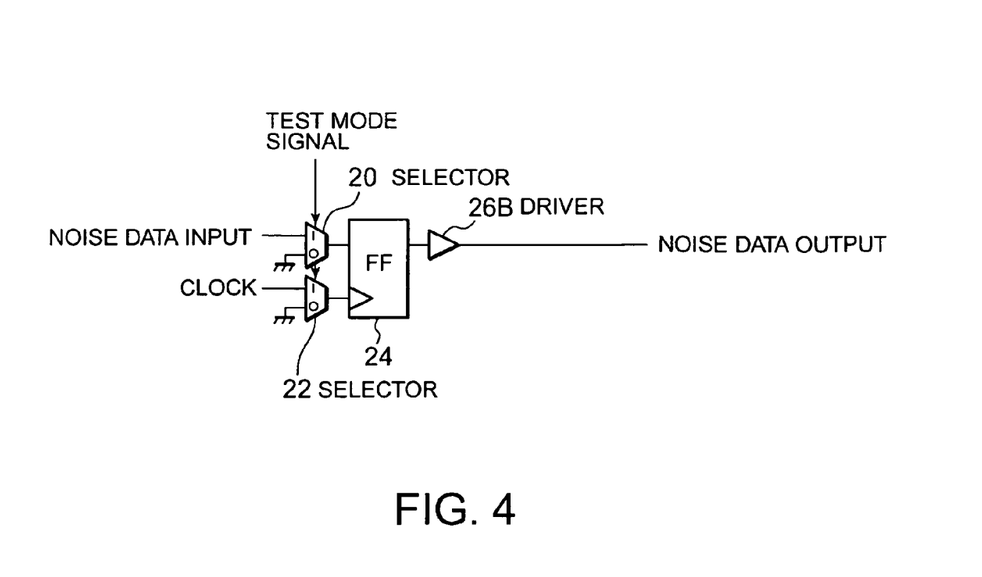
FIG. 4 is a diagram showing a unit circuit included in a power supply noise resistance testing circuit according to Embodiment 3 of the present invention.

FIG. 4 is a diagram showing a unit circuit included in a power supply noise resistance testing circuit according to Embodiment 3 of the present invention.

A structure in this embodiment is significantly different from that in Embodiment 1 in a point that only a driver is provided to obtain the power supply noise resistance.

That is, according to the feature of a power supply noise resistance testing circuit 10B (not shown in FIG. 4) in this embodiment, as shown in FIG. 4, a unit circuit. 18B includes not an on-chip capacitor but a driver 26B having a capacitance sufficient to obtain the power supply noise resistance.

Structures in this embodiment which are other than the above-mentioned structure are identical to those in Embodiment 1. Therefore, the same constituent portions are expressed by the same reference symbols and the detailed description is omitted here.

Next, an operation of this embodiment will be described with reference to FIG. 4.

The operation of this embodiment is identical to the operation in Embodiment 1 except that the same form as that in Embodiment 1 is effected by the capacitance of the driver 26B in each of the test mode and the non-test mode.

As described above, according to the structure in this embodiment, the same power supply noise resistance test as that in Embodiment 1 can be performed. In addition, it is useful to have the power supply noise resistance without providing the on-chip capacitor.

Embodiment 4

Figure 5:
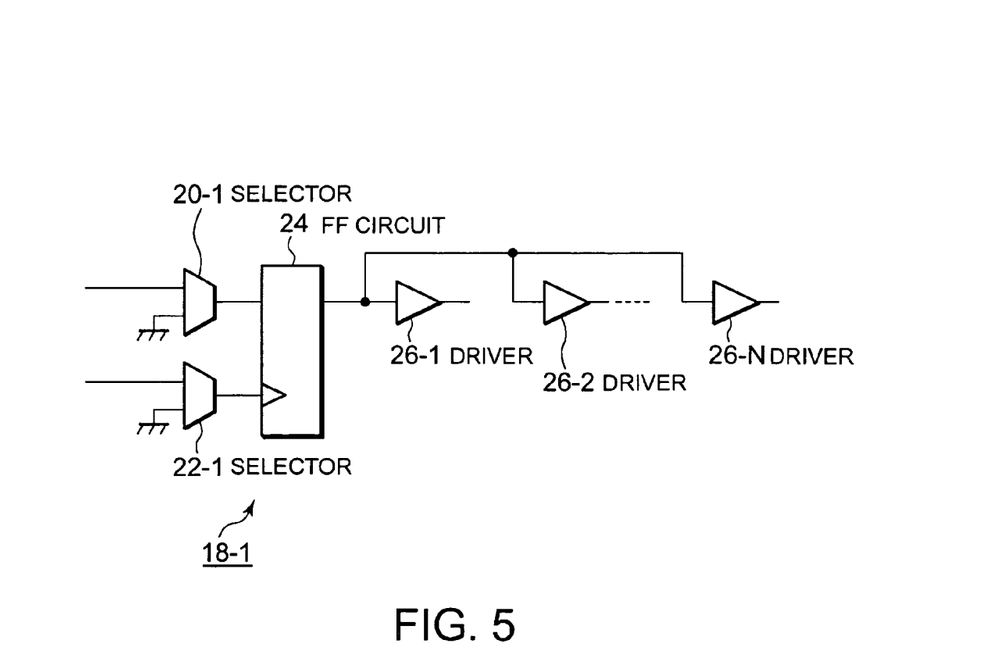
FIG. 5 is a diagram showing an on-chip capacitor/power supply noise generating circuit included in a power supply noise resistance testing circuit according to Embodiment 4 of the present invention.

FIG. 5 is a diagram showing an on-chip capacitor/power supply noise generating circuit included in a power supply noise resistance testing circuit according to Embodiment 4 of the present invention.

A structure in this embodiment is significantly different from that in Embodiment 1 in a point that a part of a unit circuit is commonly used with another unit circuit.

That is, according to the feature of a power supply noise resistance testing circuit 10C (not shown in FIG. 5) in this embodiment, as shown in FIG. 5, a unit circuit 18-1 includes selectors 20-1 and 22-1 and a FF circuit 24-1 which is commonly used with other unit circuits 18-2, 18-3, ..., and 18-N. In other words, an output terminal of the FF circuit 24-1 is connected with each of input terminals of drivers 26-2, 26-3, ..., and 26-N of the other unit circuits 18-2, 18-3, ..., and 18-N.

Structures in this embodiment which are other than the above-mentioned structure are identical to those in Embodiment 2. Therefore, the same constituent portions are expressed by the same reference symbols and the detailed description is omitted here.

Figure 8:
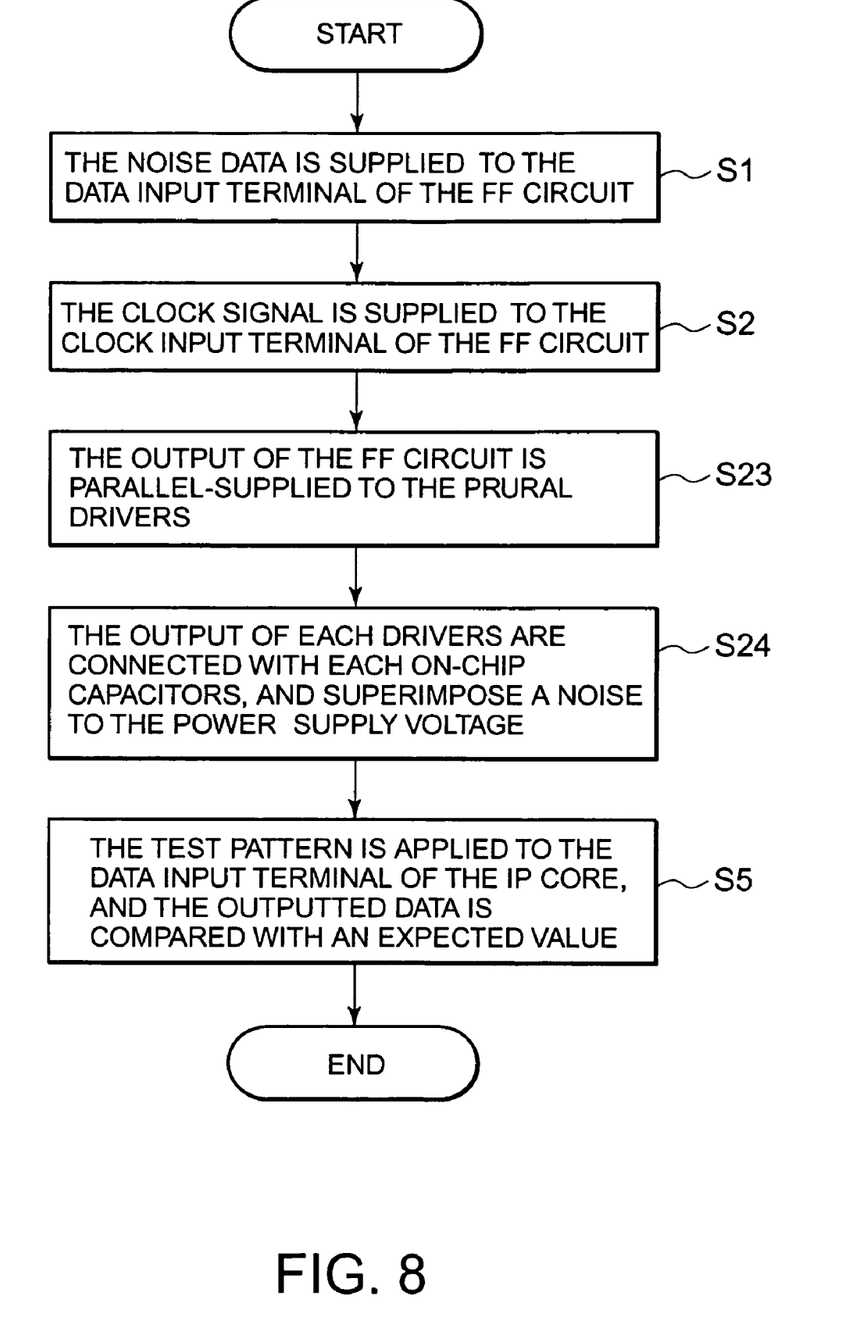
FIG. 8 is a diagram showing operations of a power supply noise resistance testing circuit according to Embodiment 4 of the present invention.

Next, an operation of this embodiment will be described with reference to FIGS. 5 and 8.

The operation of this embodiment is identical to the operation in Embodiment 1 except for the following operation. In the test mode, the selectors 20-1 and 22-1 and the FF circuit 24-1 of a unit circuit 18-1 operate as in Embodiment 1 (step S1 and S2). Therefore, a signal corresponding to power supply noise data is supplied from the FF circuit 24-1 to the driver 26-1. In addition, the signal is parallel-supplied to the subsequent drivers 26-2, 26-3, ..., and 26-N (step S23). In the non-test mode, the power supply noise data is clamped to "0", so a corresponding output signal is parallel-supplied from the FF circuit 24-1 to the subsequent drivers 26-2, 26-3, and 26-N. Therefore, each of on-chip capacitors of the respective unit circuits 18-2, 18-3, ..., and 18-N is equivalently connected in parallel with the power supply line of the IP core to enhance the power supply noise resistance. The outputs of plural drivers are connected with each on-chip capacitors, and superimpose a noise to the power supply voltage (step S24). In parallel, as well as other embodiments, the test pattern is applied to the data input terminal of the IP core, and the outputted data is compared with an expected value (step S5)

The detailed description of the same operation is omitted here.

As described above, according to the structure in this embodiment, the same effects as those in Embodiment 1 can be obtained. In addition to this, the common use of the unit circuits can be realized.

The embodiments of the present invention are described in detail with reference to the drawings. The specific structures in the present invention are not limited to the above-mentioned embodiments. Therefore, design modifications or the like which are made without departing from the spirit of the present invention are involved in the present invention.

In the embodiments, the example in which the on-chip capacitor/power supply noise generating circuit is provided around the IP core is described. The on-chip capacitor/power supply noise generating circuit may be provided inside the IP core.

In the embodiments, the structure is described in which the noise data of the preset data pattern is inputted into the first stage unit circuit of the series-connected unit circuits included in the on-chip capacitor/power supply noise generating circuit. Another power supply noise generating circuit connected with a power supply other than the main power supply of the IP core can be also used to embody the present invention. In this case, a pattern of the noise data and a signal transmission delay are considered.

What is claimed is:

1. A power supply noise resistance testing circuit, comprising:
   a power supply noise generating circuit which is provided in one of a peripheral portion and an inner portion of a functional block and includes a power supply portion, for generating a power supply noise, a test pattern being applied to a data input portion of said functional block formed on a semiconductor chip and a voltage superimposing said power supply noise being supplied to a power supply portion of said functional block to test a power supply noise resistance of said functional block, said power supply noise generating circuit being formed on the semiconductor chip; and
   a connection path for connecting the power supply portion of the power supply noise generating circuit with a power supply portion of the functional block to transmit said power supply noise.

2. The power supply noise resistance testing circuit according to claim 1, wherein said power supply noise generating circuit comprises drive control means for generating said power supply noise.

3. The power supply noise resistance testing circuit according to claim 1, wherein said power supply portion of said functional block comprises a main power supply of said functional block.

4. The power supply noise resistance testing circuit according to claim 1, wherein said power supply portion of said functional block comprises a power supply other than a main power supply of said functional block.

5. The power supply noise resistance testing circuit according to claim 1, wherein said power supply noise generating circuit comprises a plurality of noise generating circuits connected in series, each of which includes an output portion connected with an on-chip capacitor when said functional block operates.

6. The power supply noise resistance testing circuit according to claim 5, wherein said output portion of each of said noise generating circuits comprises a positive phase output portion and a negative phase output portion, each of which is connected with said on-chip capacitor when said functional block operates.

7. The power supply noise resistance testing circuit according to claim 5, wherein:
   each of the noise generating circuits comprises:
      a first selector including an output terminal, for selecting one of a noise signal outputted from drive control means and a reference potential based on a test mode signal outputted from said drive control means of said power supply noise generating circuit;
      a second selector including an output terminal, for selecting one of a clock signal and said reference potential based on said test mode signal outputted from said drive control means;
      a bistable circuit including a first input terminal connected with said output terminal of said first selector, a second input terminal connected with said output terminal of said second selector, and an output terminal; and
      a driver connected with said output terminal of said bistable circuit; and
   said driver includes an output terminal connected with said on-chip capacitor when said functional block operates.

8. The power supply noise resistance testing circuit according to claim 7, wherein:
   in one of said power supply noise generating circuits, an output signal from said driver of a noise generating circuit preceding to said one of said noise generating circuits is supplied as said noise signal to said first selector of said one of said noise generating circuits;
   said clock signal is supplied to said second selector of said one of said noise generating circuits;
   an output signal from said driver of said one of said noise generating-circuits is supplied as said noise signal to said output terminal of said first selector of a noise generating circuit subsequent to said one of said noise generating circuits; and
   said clock signal is supplied to said second selector of said noise generating circuit subsequent to said one of said noise generating circuits.

9. The power supply noise resistance testing circuit according to claim 5, wherein:
   a first noise generating circuit of said power supply noise generating circuits comprises:
      a first selector including an output terminal, for selecting one of a noise signal outputted from drive control means of said power supply noise generating circuit and a reference potential based on a test mode signal outputted from the drive control means;
      a second selector including an output terminal, for selecting one of a clock signal and said reference potential based on said test mode signal outputted from the drive control means;
      a bistable circuit including a first input terminal connected with said output terminal of said first selector, a second input terminal connected with said output terminal of said second selector, and an output terminal; and
      a first driver connected with said output terminal of said bistable circuit;
   said first driver includes an output terminal connected with said on-chip capacitor when said functional block operates;
   a second noise generating circuit of said noise generating circuits comprises a second driver connected with said output terminal of said first driver;
   said second driver includes an output terminal connected with said on-chip capacitor when said functional block operates; and
   each of noise generating circuits subsequent to said second noise generating circuit has a structure identical to said structure of said second noise generating circuit.

10. The power supply noise resistance testing circuit according to claim 6, wherein:
    a first noise generating circuit of said noise generating circuits comprises:
       a first selector including an output terminal, for selecting one of a noise signal outputted from a drive control means of said power supply noise generating circuit and a reference potential;
       a second selector including an output terminal, for selecting one of a clock signal and said reference potential;
       a bistable circuit including a first input terminal connected with said output terminal of said first selector, a second input terminal connected with said output terminal of said second selector, a positive phase output terminal, and a negative phase output terminal;

a first driver connected with said positive phase output terminal of said bistable circuit; and a second driver connected with said negative phase output terminal of said bistable circuit;

said first driver includes an output terminal connected with an on-chip capacitor when said functional block operates;

said second driver includes an output terminal connected with an on-chip capacitor when said functional block operates; and each of noise generating circuits subsequent to said first noise generating circuit comprises:

a positive phase noise data transmission system including a selector, a bistable circuit, and a driver in which an output signal from the first driver sequentially passes therethrough, said driver including an output terminal connected with an on-chip capacitor when said functional block operates; and a negative phase noise data transmission system including a selector, a bistable circuit, and a driver in which an output signal from said second driver sequentially passes therethrough, said driver including an output terminal connected with an on-chip capacitor when said functional block operates.

11. The power supply noise resistance testing circuit according to claim 5, wherein:

said on-chip capacitor comprises a semiconductor device including a control electrode; and said control electrode of said semiconductor device is connected with said output portion of each of said noise generating circuit.

12. The power supply noise resistance testing circuit according to claim 11, wherein:

said on-chip capacitor comprises:

a first field effect transistor of a first conductivity type, including a gate;

a second field effect transistor of a second conductivity type reverse to said first conductivity type, including a gate; and an inverter including an input terminal and an output terminal connected with said gate of said second field effect transistor; and said gate of said first field effect transistor and said input terminal of said inverter are connected with an output terminal of a driver.

13. The power supply noise resistance testing circuit according to claim 10, wherein:

said on-chip capacitor connected with said first driver comprises a first field effect transistor of a first conductivity type; and said on-chip capacitor connected with said second driver comprises a second field effect transistor of a second conductivity type reverse to said first conductivity type.

14. The power supply noise resistance testing circuit according to claim 1, wherein:

said power supply noise generating circuit comprises a plurality of noise generating circuits connected in series; and each of said noise generating circuits comprises:

a first selector including an output terminal, for selecting one of a noise signal outputted from drive control means of said power supply noise generating circuit and a reference potential based on a test mode signal outputted from said drive control means;

a second selector including an output terminal, for selecting one of a clock signal and said reference potential based on said test mode signal outputted from said drive control means;

a bistable circuit including a first input terminal connected with said output terminal of said first selector, a second input terminal connected with said output terminal of said second selector, and an output terminal; and a driver connected with said output terminal of said bistable circuit.

15. A power supply noise resistance testing method, comprising:

supplying a voltage on which a power supply noise generated by a power supply noise generating circuit formed on a semiconductor chip, is superimposed to a power supply portion formed in one of a peripheral portion and an inner portion of said functional block; and applying a test pattern to a data input portion of said functional block formed on said semiconductor chip to test a power supply noise resistance of said functional block.

16. The power supply noise resistance testing method according to claim 15, wherein:

supplying said voltage comprises supplying noise data to a gate of a n-type or p-type MOS transistor connected with a power supply or a GND formed in one of a peripheral portion and an inner portion of said functional block.

* * * * *